United States Patent [19]

Laud

[11] Patent Number: 5,392,315
[45] Date of Patent: Feb. 21, 1995

[54] FIR FILTER COEFFICIENT UPDATING SYSTEM

[75] Inventor: Timothy G. Laud, Mundelein, Ill.

[73] Assignee: Zenith Eletronics Corporation, Glenview, Ill.

[21] Appl. No.: 936,144

[22] Filed: Aug. 26, 1992

[51] Int. Cl.6 .................... H03H 7/30; H03H 7/40; G06F 15/31
[52] U.S. Cl. .................... 375/14; 375/12; 375/16; 364/724.2; 364/724.19
[58] Field of Search .................... 375/11–16; 364/724.2, 724.19

[56] References Cited

U.S. PATENT DOCUMENTS

| | | | |
|---|---|---|---|
| 4,584,696 | 4/1986 | Beeman et al. | 375/99 |
| 4,754,419 | 6/1988 | Iwata | 364/724 |
| 4,829,463 | 5/1989 | Kakishita et al. | 364/724.19 |
| 5,243,624 | 9/1993 | Paik et al. | 375/14 |

Primary Examiner—Stephen Chin
Assistant Examiner—Kevin Kim

[57] ABSTRACT

A coefficient updating system for a time sampled filter, such as a finite impulse response filter, includes a new coefficient register for updating the coefficients stored in the filter register. In order to preclude the generation of partial products in the filter from including a combination of old and new coefficients, the old coefficients are replaced by corresponding new coefficients in a time sequential manner at the rate at which the filter is clocked.

12 Claims, 2 Drawing Sheets

Fig. 2

| CLK | W1 | W2 | W3 | W4 | W5 | W6 | W7 | W8 | W9 | W10 | W11 | W12 | W13 |
|---|---|---|---|---|---|---|---|---|---|---|---|---|---|
| Data A | $C_3W_1$ | $C_3W_2$ | $C_3W_3$ | $C_3W_4$ | $C_3W_5$ | $C_3W_6$ | $C_3W_7$ | $C_3W_8$ | $C_3W_9$ | $C_3W_{10}$ | $C_3W_{11}$ | | |
| B | $C_2W_1$ | $C_2W_2$ | $C_2W_3$ | $C_2W_4$ | $C_2W_5$ | $C_2W_6$ | $C_2W_7$ | $C_2W_8$ | $C_2W_9$ | $C_2W_{10}$ | $C_2W_{11}$ | | |
| C | $C_1W_1$ | $C_1W_2$ | $C_1W_3$ | $C_1W_4$ | $C_1W_5$ | $C_1W_6$ | $C_1W_7$ | $C_1W_8$ | $C_1W_9$ | $C_1W_{10}$ | $C_1W_{11}$ | | |
| D | $C_0W_1$ | $C_0W_2$ | $C_0W_3$ | $C_0W_4$ | $C_0W_5$ | $C_0W_6$ | $C_0W_7$ | $C_0W_8$ | $C_0W_9$ | $C_0W_{10}$ | $C_0W_{11}$ | | |
| $(A^{-1})E$ | — | $C_3W_1$ | $C_3W_2$ | $C_3W_3$ | $C_3W_4$ | $C_3W_5$ | $C_3W_6$ | $C_3W_7$ | $C_3W_8$ | $C_3W_9$ | $C_3W_{10}$ | | |
| $(A^{-2})F$ | — | — | $C_3W_1$ | $C_3W_2$ | $C_3W_3$ | $C_3W_4$ | $C_3W_5$ | $C_3W_6$ | $C_3W_7$ | $C_3W_8$ | $C_3W_9$ | | |
| $(F+B^{-1})G$ | — | $C_2W_1$ | $C_3W_1+C_2W_2$ | $C_3W_2+C_2W_3$ | $C_3W_3+C_2W_4$ | $C_3W_4+C_2W_5$ | $C_3W_5+C_2W_6$ | $C_3W_6+C_2W_7$ | $C_3W_7+C_2W_8$ | $C_3W_8+C_2W_9$ | $C_3W_9+C_2W_{10}$ | | |
| $(G^{-1})H$ | — | — | $C_2W_1$ | $C_3W_1+C_2W_2$ | $C_3W_2+C_2W_3$ | $C_3W_3+C_2W_4$ | $C_3W_4+C_2W_5$ | $C_3W_5+C_2W_6$ | $C_3W_6+C_2W_7$ | $C_3W_7+C_2W_8$ | $C_3W_8+C_2W_9$ | | |
| $(H+C^{-1})I$ | — | $C_1W_1$ | $C_2W_1+C_1W_2$ | $C_3W_1+C_2W_2+C_1W_3$ | $C_3W_2+C_2W_3+C_1W_4$ | $C_3W_3+C_2W_4+C_1W_5$ | $C_3W_4+C_2W_5+C_1W_6$ | $C_3W_5+C_2W_6+C_1W_7$ | $C_3W_6+C_2W_7+C_1W_8$ | $C_3W_7+C_2W_8+C_1W_9$ | $C_3W_8+C_2W_9+C_1W_{10}$ | | |
| $(I^{-1})J$ | — | — | $C_1W_1$ | $C_2W_1+C_1W_2$ | $C_3W_1+C_2W_2+C_1W_3$ | $C_3W_2+C_2W_3+C_1W_4$ | $C_3W_3+C_2W_4+C_1W_5$ | $C_3W_4+C_2W_5+C_1W_6$ | $C_3W_5+C_2W_6+C_1W_7$ | $C_3W_6+C_2W_7+C_1W_8$ | $C_3W_7+C_2W_8+C_1W_9$ | | |
| $(J+D^{-1})K$ | — | $C_0W_1$ | $C_1W_1+C_0W_2$ | $C_2W_1+C_1W_2+C_0W_3$ | $C_3W_1+C_2W_2+C_1W_3+C_0W_4$ | $C_3W_2+C_2W_3+C_1W_4+C_0W_5$ | $C_3W_3+C_2W_4+C_1W_5+C_0W_6$ | $C_3W_4+C_2W_5+C_1W_6+C_0W_7$ | $C_3W_5+C_2W_6+C_1W_7+C_0W_8$ | $C_3W_6+C_2W_7+C_1W_8+C_0W_9$ | $C_3W_7+C_2W_8+C_1W_9+C_0W_{10}$ | | |

FIR FILTER COEFFICIENT UPDATING SYSTEM

BACKGROUND OF THE INVENTION

The present invention relates to time sampled filters such as finite impulse response (FIR) filters and particularly concerns techniques for updating the coefficients used to control the response of the filters.

FIR filters are used in many applications which require adaptation of the filter response to different conditions. For example, the frequency response of FIR filters used in channel equalizers must be updated from time to time to accommodate different channel impairments which may arise. The frequency response of a FIR filter is typically altered by changing the coefficients used to control the filter. Prior art systems for effecting changes in the values of FIR filter coefficients, however, normally produce an undesired glitch in the output signal resulting from the production of partial products based upon a combination of new and old coefficients. These glitches may be more or less extensive depending on the particular coefficient updating system employed.

For example, in one prior art system, the coefficients used to control the filter are stored in a resister which is updated to reflect a change in one or more of the coefficients by serially shifting an entire new set of coefficients into the register. This produces a condition wherein the filter output is incorrect for the time period required for the new set of coefficients to assume their proper relative positions in the register and for a further time period equal to the total serial delay characterizing the filter. In another prior art system, a second register is initially loaded with the new set of coefficients, which are then simultaneously supplied in parallel to update the coefficient register. This approach still results in an incorrect output signal for a time equivalent to the serial delay characterizing the filter. Finally, it is also known to individually update the coefficients stored in the coefficient register to reduce the extent of the glitch produced at the output of the filter, when only a relatively small number of the coefficients need to be changed. This is, however, not an adequate solution when a large number of the coefficients need to be changed.

One way to lessen the foregoing problems is to hide the glitches produced at the filter output during coefficient updating. This may be done, for example, in a video signal by restricting the time period during which coefficients may be updated to the vertical blanking interval of the signal. This approach reduces the flexibility of the system and may not be applicable to different types of signals and is therefore not particularly desirable.

It is therefore a basic object of the present invention to provide an improved system for updating the coefficients controlling a time sampled filter such as a FIR filter.

It is a more specific object of the invention to provide a filter coefficient updating system which eliminates glitches from the filter output resulting from the production of partial products in the filter based upon a combination of new and old coefficients.

BRIEF DESCRIPTION OF THE DRAWINGS

These and other objects and advantages of the invention will be apparent upon reading the following description in conjunction with the drawing, in which:

FIG. 2 is a chart illustrating the operation of the filter coefficient updating system of FIG. 1.

DESCRIPTION OF THE PREFERRED EMBODIMENT

Figure 1:
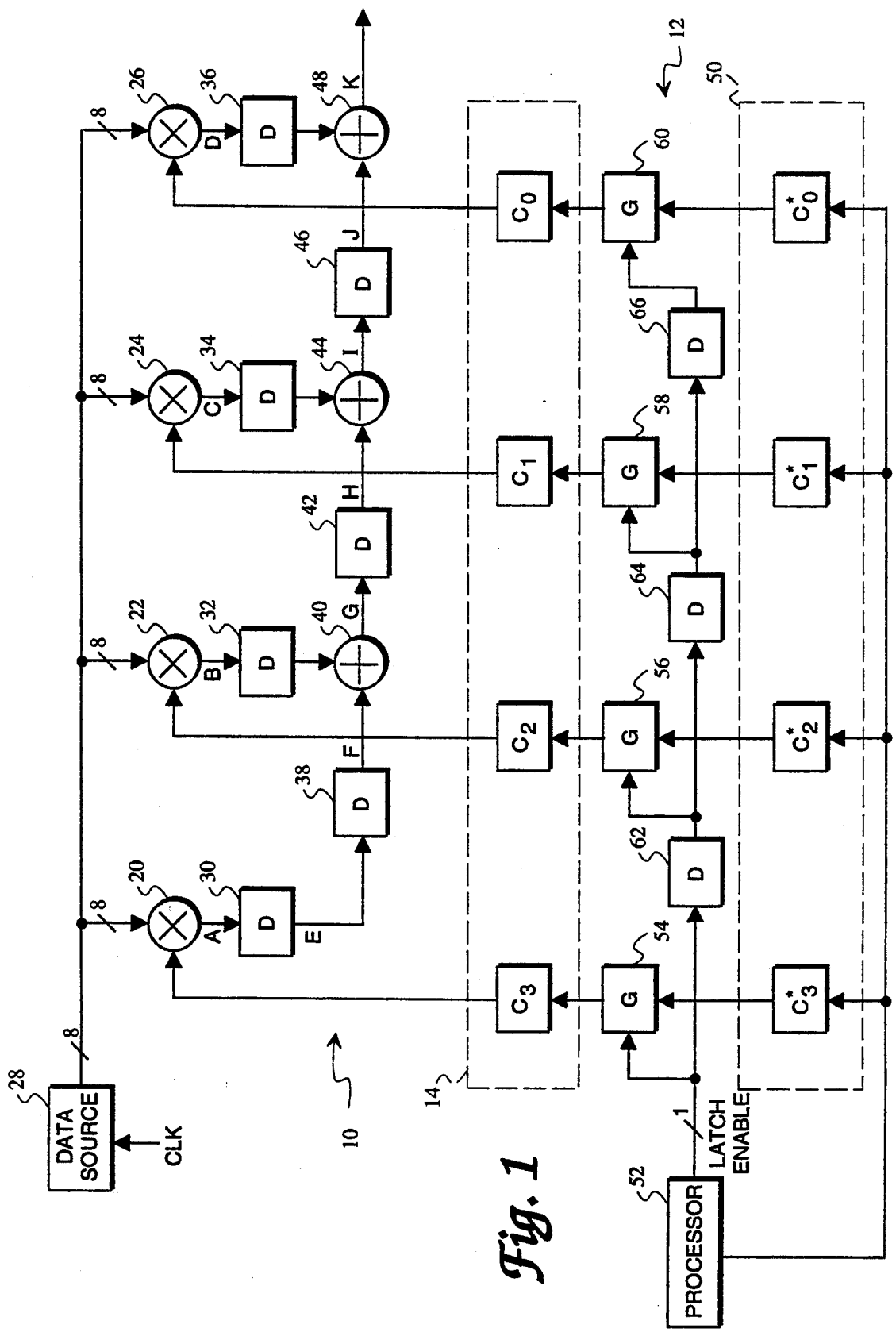
FIG. 1 is a simplified block diagram of a FIR filter and the filter coefficient updating system of the invention.

Referring to FIG. 1, there is shown a FIR filter, generally indicated by reference numeral 10, and a filter coefficient updating system 12 according to the invention. For purposes of simplicity and clarity, FIR filter 10 is shown as having only four stages or taps, but it will be appreciated that in a practical filter embodiment many more stages will normally be provided (64 being typical). The present invention is applicable to a filter having any number of stages.

In FIG. 1, FIR filter 10 comprises four multipliers 20, 22, 24 and 26, each having an input terminal connected to an input data source 28. Input data source 28 may provide a sequence of 8-bit data words to each of the multipliers at the rate of a clock signal CLK. A coefficient register 14 supplies a coefficient $C_3$ to multiplier 20, a coefficient $C_2$ to multiplier 22, a coefficient $C_1$, to multiplier 24 and a coefficient $C_0$ to multiplier 26. Each multiplier 20, 22, 24 and 26 multiplies a current input data word with its respective coefficient $C_3$, $C_2$, $C_1$ and $C_0$ and supplies the product to a respective delay circuit 30, 32, 34 and 36. Each of the delay circuits 30, 32, 34, and 36, together with the other delay circuits depicted in FIG. 1 and to be described hereinafter, have a delay corresponding to the period of clock signal CLK. The output of delay circuit 30 is applied to a further delay circuit 38 whose output is summed with the output of delay circuit 32 in a summer 40. The output of summer 40 is delayed in a delay circuit 42 and summed with the output of delay circuit 34 in a summer 44. Finally, the output of summer 44 is delayed by a delay circuit 46 and summed with the output of delay circuit 36 in a summer 48 to provide the filter output signal. It will be appreciated that the response of filter 10 will be dependent upon the particular values selected for coefficients $C_3$, $C_2$, $C_1$, and $C_0$. Also, as previously mentioned, it will be appreciated that filter 10 will typically comprise additional stages of a construction similar to that shown in FIG. 1.

From the foregoing description, it will be apparent that the output E of delay circuit 30 corresponds to the output A of multiplier 20 delayed by one period of clock signal CLK, the output F of delay circuit 38 to the output A of multiplier 20 delayed by two periods of clock signal CLK, the output G of summer 40 to the output F of delay circuit 38 plus the output B of multiplier 22 delayed by one period of clock signal CLK, the output H of delay circuit 42 to the output G of summer 40 delayed by one period of clock signal CLK, the output I of summer 44 to the output H of delay circuit 42 plus the output C of multiplier 24 delayed by one period of clock signal CLK, the output J of delay circuit 46 to the output I of summer 44 delayed by one period of clock signal CLK and the output K of summer 48 to the output J of delay circuit 46 plus the output D of multiplier 26 delayed by one period of clock signal CLK. These relationships can be conveniently summarized as follows, wherein the use of an exponential corresponds to a delay of one period of clock signal CLK,:

(1) $E = A^{-1}$
(2) $F = A^{-2}$
(3) $G = A^{-2} + B^{-1}$
(4) $H = A^{-3} + B^{-2}$
(5) $I = A^{-3} + B^{-2} + C^{-1}$
(6) $J = A^{-4} + B^{-3} + C^{-2}$
(7) $K = A^{-4} + B^{-3} + C^{-2} + D^{-1}$

Referring to the first six columns of FIG. 2, the operation of filter 10 is illustrated for six consecutive data words $W_1-W_6$ supplied by data source 28. It will be seen that the filter output K is $C_0W_1$ after one clock period, $C_1W_1 + C_0W_2$ after two clock periods, and so on until the output $C_3W_2 + C_2W_3 + C_1W_4 + C_0W_5$ is achieved after five clock periods. At this point a coefficient updating step is initiated as described below.

Returning to FIG. 1, the coefficient updating system 12 includes a second register 50 in which a series of new coefficients $C^*_3$, $C^*_2$, $C^*_1$, and $C^*_0$ are loaded from a processor 52. It will be understood that all of the new coefficients $C^*_3-C^*_0$ may be different from the corresponding old coefficients $C_3-C_0$ or only some of them may differ. In any case, each of the new coefficients $C^*_3-C^*_0$ is applied through a respective transmission gate 54-60 to a corresponding storage location in register 14. Processor 52 develops a one-bit latch enable signal which is applied to transmission gate 54, to transmission gate 56 through a delay circuit 62, to transmission gate 58 through delay circuit 62 and a further delay circuit 64 and to transmission gate 60 through delay circuits 62 and 64 and a further delay circuit 66. Therefore, coefficient $C_3$ will initially be updated to new coefficient $C^*_3$, followed one clock period later by coefficient $C_2$ being updated to new coefficient $C^*_2$ and so on. In other words, the filter coefficients stored in register 14 are sequentially updated at the clock rate of the filter.

The coefficient updating process is illustrated in FIG. 2 beginning with the seventh column at which time multiplier 20 forms the product $C^*_3W_7$, while the remaining multipliers 22-26 continue to form products based on the old coefficients. During the next clock period coefficient $C_2$ is updated so that the outputs of multipliers 20 and 22 are $C^*_3W_8$ and $C_2^*W_8$ respectively, while multipliers 24 and 26 continue to generate products based on the old coefficients. This process continues until all of the coefficients have been updated during the clock period corresponding to data word $W_{11}$. From an inspection of the chart of FIG. 2, and according to an important aspect of the invention, it will be noted that there are no partial products (i.e. outputs G-K) generated by filter 10 which comprise a combination of old and new coefficients. This results from the sequential updating of the coefficients of register 14 at the clock rate of the filter. Perhaps of most significance is the fact that the filter output K has no terms which comprise a mixture of old and new coefficients. That is, four clock periods after initiating the coefficient updating process, a filter output is generated comprising only of new coefficient terms, while all outputs prior thereto are comprised of only old coefficient terms.

What has been described is a novel system for updating the coefficients of a time sampled filter such as a FIR filter. It is recognized that numerous changes in the described embodiment of the invention will be apparent to those skilled in the art without departing from its true spirit and scope. The invention is to be limited only as defined in the claims.

What is claimed is:

1. In a time sampled filter of the type including a plurality of current coefficients establishing a current filter response characteristic, a system for updating the values of said coefficients comprising:

means for storing a plurality of new coefficients each corresponding to a respective one of said current coefficients and collectively representing a new filter response characteristic; and means for successively replacing each of said current coefficients of said filter with the corresponding one of said new coefficients at a rate related to the clock rate of said filter to effect a change in said filter from said current filter response characteristic to said new filter response characteristic.

2. In a time sampled filter of the type operating at a predetermined clock rate and including a filter register storing a plurality of current coefficients establishing a current filter response characteristic, an improved coefficient updating system comprising:

an update register storing a plurality of new coefficients, each of said new coefficients corresponding to a respective one of said current coefficients stored in said filter register and collectively representing a new filter response characteristic; and means for successively replacing each of said current coefficients stored in said filter register with the corresponding one of said new coefficients stored in said update register at said predetermined clock rate to effect a change in said filter from said current filter response characteristic to said new filter response characteristic.

3. The coefficient updating system of claim 2 wherein said time sample filter comprises a finite impulse response filter.

4. The coefficient updating system of claim 2 including a plurality of transmission gates coupled between said update register and said filter register, each of said transmission gates being operable for replacing a respective one of the current coefficients stored in said filter register with the corresponding new coefficient stored in said update register.

5. The coefficient updating system of claim 4 including means for generating a plurality of time sequential control signals at said predetermined clock rate and means for supplying each of said control signals for operating a respective one of said transmission gates.

6. The coefficient updating system of claim 5 wherein said control signal generating means comprises a plurality of serially connected delay circuits responsive to an input enable signal.

7. In a time sampled filter of the type generating a plurality of partial product terms in response to an applied input signal and having a plurality of current coefficients stored in a filter register which collectively establish a current filter response characteristic, an improved coefficient updating system comprising:

an update register storing a plurality of new coefficients each corresponding to a respective one of said current coefficients and collectively representing a new filter response characteristic; and means for successively replacing each of said current coefficients stored in said filter register with the corresponding one of said new coefficients stored in said update register to effect a change in said filter from said current filter response characteristic to said new filter response characteristic in a manner such that each of said partial product terms comprises one or more products including only said current coefficients or only said new coefficients.

8. The coefficient updating system of claim 7 wherein said time sampled filter comprises a finite impulse response filter.

9. The coefficient updating system of claim 7 wherein said time sampled filter is operated at a predetermined clock rate and wherein said means for replacing comprises means for time sequentially replacing the current coefficients stored in said filter register with the corresponding new coefficients stored in said update register at said predetermined clock rate.

10. The coefficient updating system of claim 9 including a plurality of transmission gates coupled between said update register and said filter register, each of said transmission gates being operable for replacing a respective one of the current coefficients stored in said filter register with the corresponding new coefficient stored in said update register.

11. The coefficient updating system of claim 10 including means for generating a plurality of time sequential control signals at said predetermined clock rate and means for supplying each of said control signals for operating a respective one of said transmission gates.

12. The coefficient updating system of claim 11, wherein said control signal generating means comprises a plurality of serially connected delay circuits responsive to an input enable signal.

* * * * *